(12) United States Patent
Lakirovich et al.

(10) Patent No.: US 10,955,448 B2
(45) Date of Patent: Mar. 23, 2021

(54) METHOD OF WIRE BREAK DETECTION

(71) Applicant: S&C Electric Company, Chicago, IL (US)

(72) Inventors: Konstantin Lakirovich, Skokie, IL (US); Christopher De Young, Los Angeles, CA (US); John French, Chicago, IL (US)

(73) Assignee: S&C Electric Company, Chicago, IL (US)

( * ) Notice: Subject to any disclaimer, the term of this patent is extended or adjusted under 35 U.S.C. 154(b) by 41 days.

(21) Appl. No.: 16/677,927

(22) Filed: Nov. 8, 2019

(65) Prior Publication Data

US 2020/0191841 A1 Jun. 18, 2020

Related U.S. Application Data

(60) Provisional application No. 62/778,481, filed on Dec. 12, 2018.

(51) Int. Cl.
  *G01R 19/25* (2006.01)
  *G01R 19/00* (2006.01)
  *G01R 31/08* (2020.01)

(52) U.S. Cl.
  CPC ..... *G01R 19/2513* (2013.01); *G01R 19/0092* (2013.01); *G01R 31/085* (2013.01)

(58) Field of Classification Search
  CPC ............ G01R 19/2513; G01R 19/0092; G01R 31/085; G01R 31/54
  USPC ......................................... 324/522, 512, 500
  See application file for complete search history.

(56) References Cited

U.S. PATENT DOCUMENTS

| | | | |
|---|---|---|---|
| 8,583,388 B2* | 11/2013 | Yaguchi | G06F 30/367 702/60 |
| 2003/0016028 A1* | 1/2003 | Bass | F16L 53/37 324/642 |
| 2006/0097741 A1* | 5/2006 | Payman | G01R 31/70 324/762.03 |
| 2010/0013632 A1 | 1/2010 | Salewske et al. | |
| 2017/0045571 A1 | 2/2017 | Joseph et al. | |

OTHER PUBLICATIONS

Gomes et al.; High-Sensitivity Vegetation High-Impedance Fault Detection Based on Signal's High-Frequency Contents; IEEE Transactions on Power Delivery, vol. 33, No. 3; Jun. 2018: p. 1398-p. 1407.

* cited by examiner

*Primary Examiner* — Giovanni Astacio-Oquendo

(57) ABSTRACT

A system and method for detecting a high impedance fault in an electrical line strung along and between utility poles, where the line is part of an electrical power distribution network. A current sensor is provided on each line segment between the utility poles, where each current sensor harvests power therefrom and continuously monitors the current flow on the line segment. An observer/repeater device is provided on a number of the poles and each is in communication with certain select ones of the current sensors to receive the current measurements therefrom. One of the observer/repeater devices compares the current readings transmitted to it from the subordinate current sensors, and if a violation of Kirchhoff's current law exists, an indication of a high impedance fault occurs, where the observer/repeater device relays the current irregularity to an upstream recloser to take appropriate action.

18 Claims, 3 Drawing Sheets

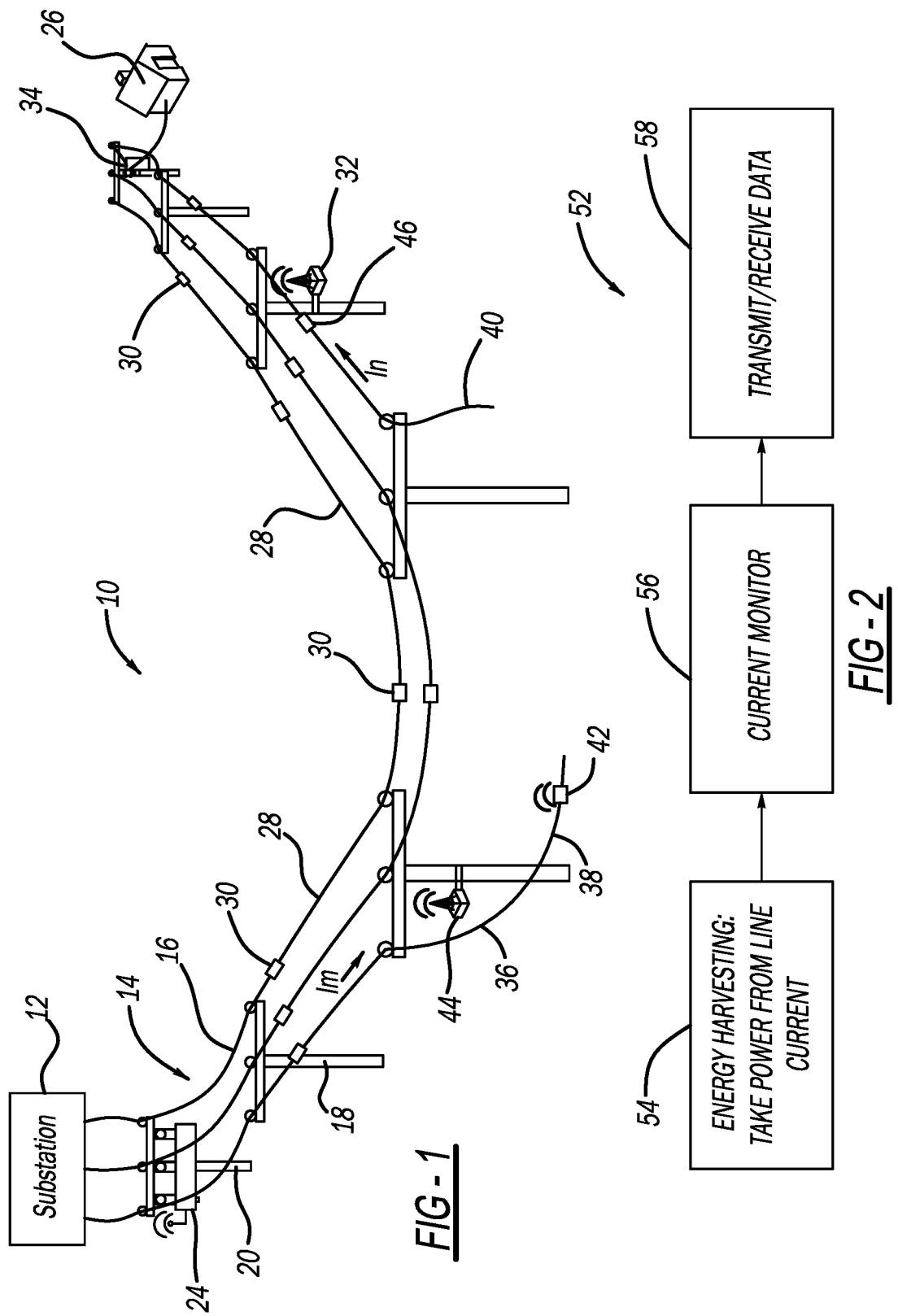

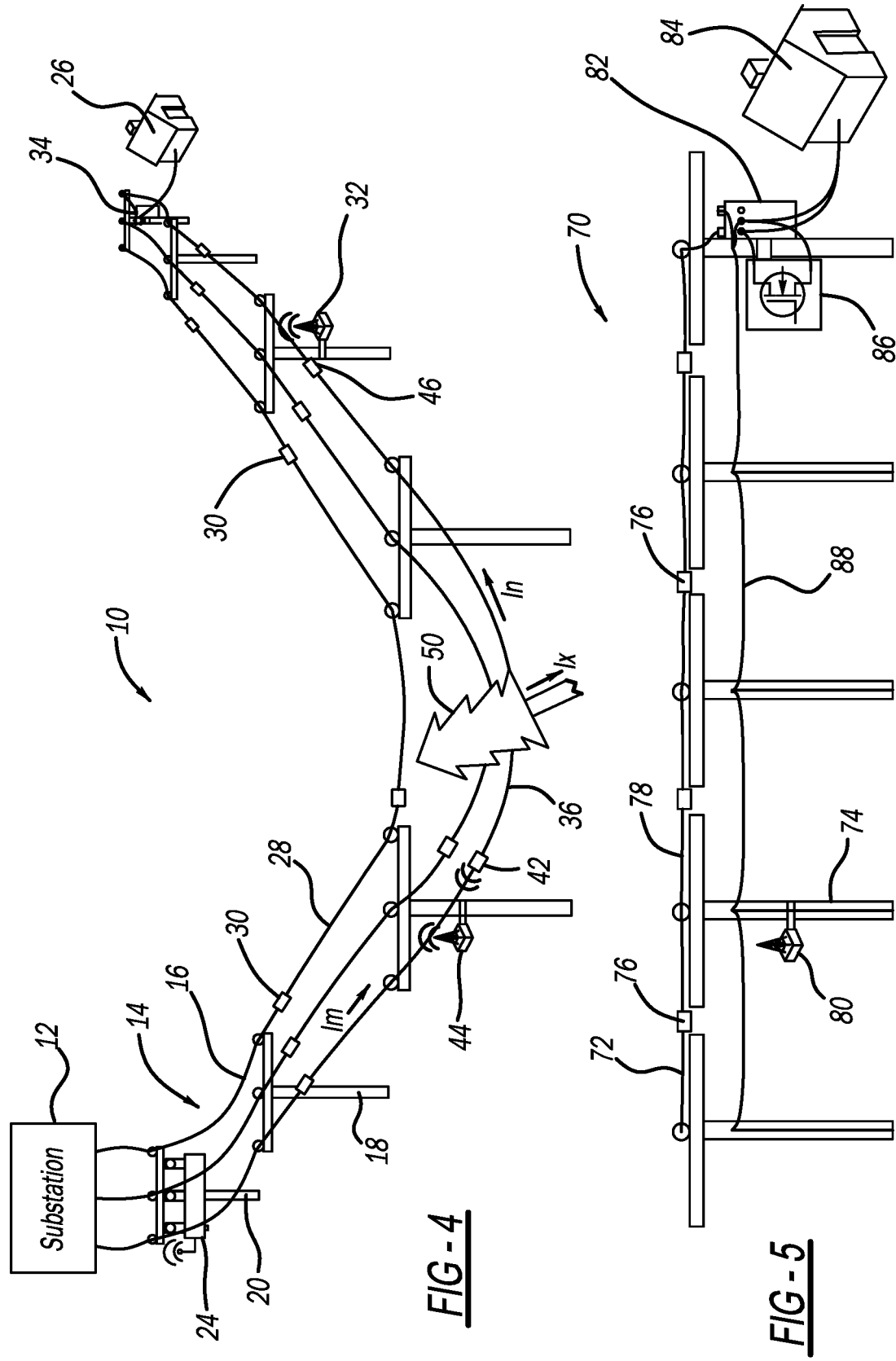

METHOD OF WIRE BREAK DETECTION

CROSS-REFERENCE TO RELATED APPLICATION

This application claims the benefit of priority from the U.S. Provisional Application No. 62/778,481, filed on Dec. 12, 2018, the disclosure of which is hereby expressly incorporated herein by reference for all purposes.

BACKGROUND

Filed

The present disclosure relates generally to a system and method for detecting a fault in an electrical power distribution network and, more particularly, to a system and method for detecting a high impedance fault in an electrical power distribution network.

Discussion of the Related Art

An electrical power distribution network, often referred to as an electrical grid, typically includes a number of power generation plants each having a number of power generators, such as gas turbine engines, nuclear reactors, coal-fired generators, hydro-electric dams, etc. The power plants provide a high voltage AC signal on high voltage transmission lines that deliver electrical power to a number of substations typically located within a community, where the voltage is stepped down to a medium voltage. The substations provide the medium voltage power to a number of three-phase feeder lines. The feeder lines are coupled to a number of lateral lines that provide the medium voltage to various distribution transformers, where the voltage is stepped down to a low voltage and is provided to a number of loads, such as homes, businesses, etc.

Periodically, faults, such as a downed line, occur in the distribution network as a result of various things, such as animals touching the lines, lightning strikes, tree branches falling on the lines, vehicle collisions with utility poles, equipment failure, etc. Faults may create an open circuit when a line breaks or a high impedance current flow when a line touches the ground or a tree, where the current flow is small and does not trigger an upstream recloser device to open, which creates a potential fire hazard or human hazard.

Techniques are known in the industry for identifying a high impedance fault or no current faults in a power distribution network as a result of a broken or downed line so as to promptly disconnect the faulty line from the power source. Often, these known techniques employ complex machine learning algorithms that use current and voltage measurements and that require a lot of machine power and constant reconfiguration when the load profile changes. It may be beneficial to provide a high impedance fault or no current detection scheme in a power distribution network that is reliable and less complex.

SUMMARY

The following discussion discloses and describes a system and method for detecting a high impedance fault in an electrical line strung along and between utility poles, where the line is part of an electrical power distribution network. A current sensor is provided on each line segment between the utility poles, where each current sensor harvests power therefrom and continuously monitors the current flow on the line segment. An observer/repeater device is provided on a number of the poles and each is in communication with certain ones of the current sensors to receive the current measurements therefrom. One of the observer/repeater devices compares the current readings transmitted to it from the subordinate current sensors, and if a violation of Kirchhoff's current law exists, an indication of a high impedance fault occurs, where the observer/repeater device relays the current irregularity to an upstream recloser to take appropriate action. The current sensors derive their energy from current on the line and if the current flow on the line is not adequate to provide power for the current sensor, an artificially applied load on the secondary side of an associated distribution transformer will temporarily increase the current on the primary current carrying line, and thus provide the additional energy required by the current sensor to operate.

Additional features of the disclosure will become apparent from the following description and appended claims, taken in conjunction with the accompanying drawings.

BRIEF DESCRIPTION OF THE DRAWINGS

FIG. 1 is a simplified illustration of an electrical power distribution network including current sensors for measuring current on the electrical lines, where one of the electrical line segments is broken;

FIG. 2 is a flow chart diagram showing a process for harvesting power and transmitting current measurements by the current sensors in the distribution network;

FIG. 4 is an illustration of the electrical power distribution network shown in FIG. 1 and showing a tree that has fallen on one of the line segments;

FIG. 5 is a simplified illustration of a single phase lateral electrical line including a semiconductor shunt coupled across a secondary side of a transformer to increase the power on the line to allow for current harvesting.

DETAILED DESCRIPTION OF THE EMBODIMENTS

Figure 3:
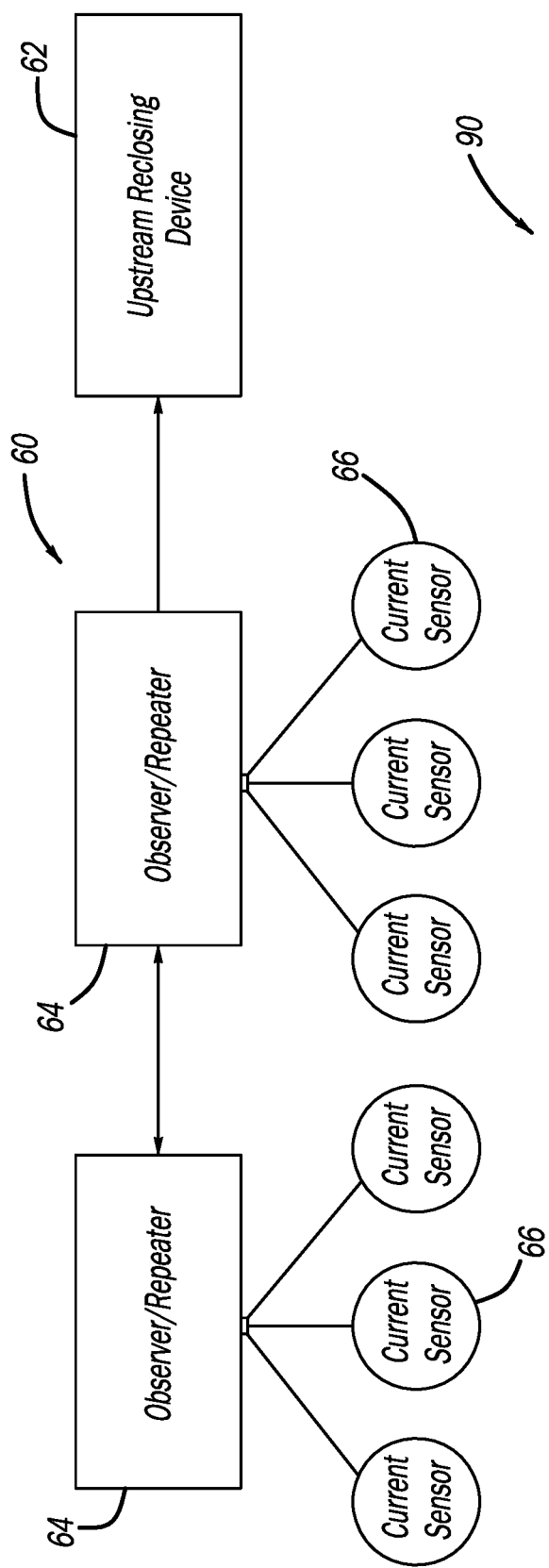
FIG. 3 is a block diagram of a system showing a communications link between current sensors, observer/repeater devices and a recloser for the power distribution network.

The following discussion of the embodiments of the disclosure directed to a system and method for detecting a high impedance fault in an electrical power distribution network is merely exemplary in nature, and is in no way intended to limit the invention or its applications or uses.

FIG. 1 is an illustration of an electrical power distribution network 10 including an electrical substation 12 that steps down high voltage power from a high voltage power line (not shown) to medium voltage power, and a three-phase feeder 14 having three single phase power lines 16 that receive the medium voltage power signal from the substation 12, where the lines 16 are suspended along and between a series of utility poles 18. One pole 20 of the utility poles 18 includes a recloser 24 that has a relay or interrupter switch (not shown) for each line 16 to allow or prevent current flow therethrough. The recloser 24 also includes sensors (not shown) for measuring the current and voltage of the power signal propagating on each line 16, a controller (not shown) for processing the measurement signals and controlling the position of the switches, and a transceiver (not shown) for transmitting data and messages to a control facility (not shown) and/or to other reclosers and components in the system 10. A load 26, shown here as a home, is connected to one of the lines 16 through a step-down distribution transformer 34.

A current sensor 30 is provided in each line segment 28 between adjacent poles 18 in all of the lines 16, where a line segment 36 is shown broken between two of the poles 18. The current sensors 30 typically include a current transformer (not shown) having a secondary winding (not shown) wound on a core (not shown), where the power line 16 extends through the core and acts as a primary winding of the transformer so that magnetic induction coupling between the core and the line 16 generates a current flow in the secondary winding so as to harvest energy therefrom. This current flow is used to power the current measurement devices and other electronics in the sensor 30, such as transmitters that wirelessly transmit the measurement signals.

FIG. 2 is a flow chart diagram 52 illustrating one of the current sensors 30 harvesting power from the line 16 at box 54, monitoring the current flow on the line 16 using that power at box 56, and transmitting and receiving data including the current measurements at box 58.

A number of observer/repeater devices 32 are mounted to select ones of the poles 18. The devices 32 include the necessary hardware and control algorithms that allow them to be in wireless communication with certain selected ones of the sensors 30 and process current measurement signals received therefrom consistent with the discussion herein. The devices 32 are also in wireless communication with each other and with the recloser 24. Although wireless communications is used in this example, the connection between the devices 32 and the recloser 24 can be wired.

FIG. 3 is a block diagram of a system 60 illustrating this feature of the system 10 and including box 62 representing the recloser 24, boxes 64 representing the devices 32 and circles 66 representing the current sensors 30. In this example, three of the current sensors 66 report to each device 64, however, this is merely for illustration purposes where any suitable number of the sensors 66 can report to each device.

Through Kirchhoff's current law, the current going into any one point along the lines 16 should be equal to the current out of that point. This fact can be used to detect a high impedance fault along the line 16, such as a line break. In the illustration shown in FIG. 1, the broken line segment 36 includes a portion 38 that is in contact with the ground and a portion 40 that is dangling in the air, where the current flow 6 through the line 16 upstream of the break is a high impedance current flow that can be measured by sensor 42 and reported to, for example, observer/repeater device 44, and the current flow $I_n$ downstream of the line break is zero, which is measured by sensor 46 and also reported to the device 44. Since the devices 32 are in communication with each other, the devices 32 may be controlled so that different devices 32 can receive the measurement signals from the sensors 42 and 46 and still identify the fault. The device 44 is continuously receiving the measurement signals from the sensors 42 and 46, and possibly other sensors 32, and compares the current measurement signals using suitable algorithms and techniques. When the comparison of the signals indicates a violation of Kirchhoff's current law, such as a high impedance measurement and a zero measurement as described, the device 44 communicates with the recloser 24 to determine whether the switch should be opened and prevent current flow downstream of the recloser 24 on that line 16.

FIG. 4 is an illustration of the electrical power distribution network 10, but instead of the line segment 36 being broken, a tree 50 is lying over the line segment 36 and provides a current path from the line segment 36 to ground, represented as current flow $I_x$. Therefore, the current flow 6 upstream of the location where the tree 50 is lying on the line segment 36 will not equal the current flow $I_n$ downstream of the tree 50, so that when the device 44 compares these current measurements from the sensors 42 and 46 and determines that Kirchhoff's current law has been violated, the device 44 will instruct the recloser 24 to open the switch in the manner described above.

The discussion above talks about the current sensors 30 harvesting power from the lines 16 in the feeder 14 where there is a significant amount of power for that purpose. However, as the lateral lines are coupled off of the feeder 14 downstream of the substation 12 and the loads draw off power, the current decreases, possibly to a level that does not allow the current sensors 30 to harvest enough power to measure the current because the current transformer in the sensor 30 is not large enough. Further, because the process needs to identify a low impedance current, it becomes more difficult to do that if the difference between the normal current and the low current is not great enough. Therefore, the technique of identifying a high impedance fault as discussed above using the current sensors 30 may not be as effective or even possible in these conditions.

FIG. 5 is an illustration of part of a power distribution network 70 including a lateral line 72 strung between and along utility poles 74. As above, a current sensor 76 is provided in each line segment 78 between the poles 74 and an observer/repeater device 80 is provided on select ones of the poles 74 and in communication with select ones of the sensors 76. A step-down distribution transformer 82 is provided on one of the poles 74 and steps down the medium voltage to a low voltage for a particular load shown here as a home 84 that is coupled to a secondary side of the transformer 82. A neutral line 88 coupled to ground is also strung between and along the utility poles 74 and is coupled to the primary side of the transformer 82.

In this illustration, the lateral line 72 does not carry enough current to adequately power the current sensors 76 to provide the current measurements. In order to overcome the power deficiency, a semiconductor shunt 86 is coupled across the secondary coil terminals of the transformer 82 to shunt output current to ground, where the shunt 86 can be any suitable semiconductor device, such as a field effect transistor (FET). The shunt 86 creates a controlled, periodic amount of limited current to ground on the secondary side of the transformer 82, which creates a temporary increase in current on the primary side of the transformer 82. This results in a temporary increase in the amount of available current to be harvested by the current sensors 76 on the lateral line 72. The shunt current is limited in time and value to maintain integrity of the transformer 82 and any downstream loads. The pulse timing of bringing the shunt 86 into and out of the circuit may be aligned with the voltage waveform or the shunt 86 may operate on a timely basis.

Figure 6:
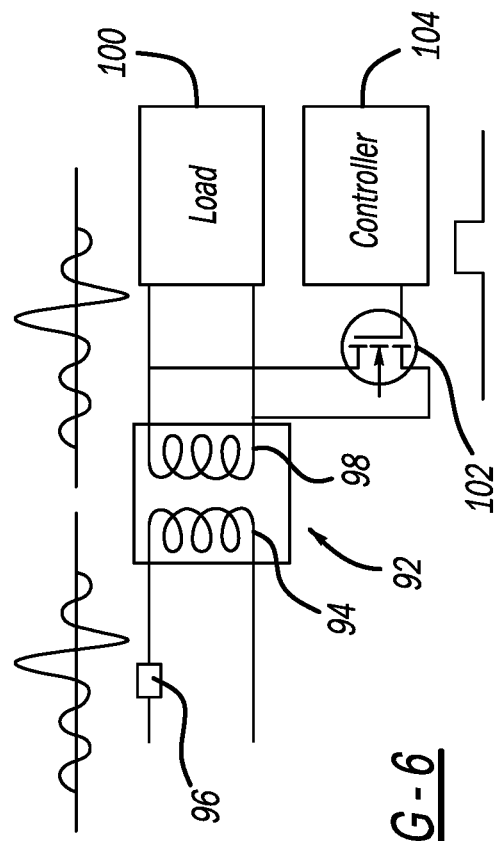
FIG. 6 is a schematic diagram showing an example of the semiconductor shunt coupled to a transformer.

FIG. 6 is a schematic diagram 90 showing a distribution transformer 92, representing the transformer 82, having a primary coil 94 coupled to a current sensor 96, representing the current sensor 76, and a secondary coil 98 coupled to a load 100, representing the home 84. The power terminals of semiconductor device 102 are coupled across the secondary coil 98 and the gate terminal of the semiconductor device 102 is connected to a controller 104. The semiconductor device 102 is switched opened and closed in a periodic manner using a pulsed control signal so that the semiconductor device 102 is coupled and decoupled from the secondary coil 98 to increase the power flowing in the primary coil 94 and maintain the operation of the transformer 92. The increase in current on the primary and secondary coils 94 and 98 is shown by the waveforms.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for identifying a high impedance fault in an electrical power distribution network, the network including a power source, at least one electrical line, a number of spaced apart utility poles supporting the at least one electrical line, a plurality of current sensors where each current sensor is positioned to measure current is a line segment of the at least one line between consecutive utility poles, at least one observer/repeater device mounted to a utility pole and a switching device for allowing or preventing current flow through the at least one electrical line, the method comprising:
    measuring the current flow through the at least one electrical line by the plurality of current sensors;
    transmitting current measurement signals from the plurality of current sensors to the at least one observer/repeater device;
    comparing the current measurement signals from at least two different ones of the current sensors in the at least one observer/repeater device;
    determining whether the comparison of the current signals indicates a fault in the at least one electrical line; and
    transmitting a signal to the switching device upstream of the fault if the comparison does indicate a fault.

2. The method according to claim 1 wherein determining whether the comparison of the current signals indicates a fault includes determining whether Kirchhoff's current law has been violated.

3. The method according to claim 1 wherein determining whether the comparison of the current signals indicates a fault includes determining if a current measurement signal from one of the sensors indicates a high impedance current and a current measurement signal from another current sensor is zero indicating a break in the at least one electrical line.

4. The method according to claim 1 wherein determining whether the comparison of the current signals indicates a fault includes determining that the measurement signals from two different current sensors measuring current in the at least one electrical line are different beyond a certain threshold.

5. The method according to claim 1 wherein the at least one observer/repeater device is a plurality of observer/repeater devices where each observer/repeater device receives current measurement signals from a plurality of the current sensors.

6. The method according to claim 1 wherein transmitting the current measurement signals includes wirelessly transmitting the signals.

7. The method according to claim 1 wherein the plurality of current sensors harvest power from the at least one electrical line to provide the current measurements.

8. The method according to claim 7 wherein the power distribution network includes at least one distribution transformer that steps down the voltage on the at least one electrical line for powering a load, the method further comprising providing a shunt across a secondary side of the transformer so as to increase power on the at least one electrical line to provide power for the current sensors.

9. The method according to claim 8 wherein the shunt is a semiconductor device.

10. The method according to claim 9 providing a shunt across the secondary side of the transformer includes switching the semiconductor device on and off to periodically provide the shunt.

11. A method for identifying a fault in an electrical power distribution network, the network including a power source, at least one electrical line, a number of spaced apart utility poles supporting the at least one electrical line, a plurality of current sensors where each current sensor is positioned to measure current is a line segment of the at least one line between consecutive utility poles, a plurality of observer/repeater devices mounted to selective ones of the utility poles and a switching device for allowing or preventing current flow through the at least one electrical line, the method comprising:
    harvesting power by the plurality of current sensors from the at least one electrical line;
    measuring the current flow through the at least one electrical line by the plurality of current sensors;
    wirelessly transmitting current measurement signals from each of the current sensors to a selected one of the observer/repeater devices;
    comparing the current measurement signals from at least two different ones of the current sensors in each of the observer/repeater devices;
    determining using Kirchhoff's current law whether the comparison of the current signals indicates a fault in the at least one electrical line; and
    transmitting a signal to the switching device upstream of the fault if the comparison does indicate a fault.

12. The method according to claim 11 wherein the power distribution network includes at least one distribution transformer that steps down the voltage on the at least one electrical line for powering a load, the method further comprising providing a shunt across a secondary side of the transformer so as to increase power on the at least one electrical line to provide power for the current sensors.

13. The method according to claim 12 wherein the shunt is a semiconductor device.

14. The method according to claim 13 providing a shunt across the secondary side of the transformer includes switching the semiconductor device on and off to periodically provide the shunt.

15. A system for identifying a fault in an electrical power distribution network, the system comprising:
    at least one electrical line strung along and between a plurality of utility poles;
    a separate current sensor provided in each line segment of the at least one electrical line between adjacent utility poles;
    a plurality of observer/repeater devices mounted to selective ones of the utility poles; and
    a switching device for allowing or preventing current flow through the at least one electrical line, wherein the plurality of current sensors harvest energy from the at least one electrical line, the plurality of current sensors measure the current flow through the at least one electrical line, the current measurement signals are wirelessly transmitted from each of the current sensors to a selected one of the observer/repeater devices, the observer/repeater devices compare the current measurement signals from at least two different ones of the current sensors and determine using Kirchhoff's current law whether the comparison of the current signals indicates a fault in the at least one electrical line, and the observer/repeater devices transmit a signal to the switching device upstream of the fault if the comparison does indicate a fault.

16. The system according to claim 15 wherein the power distribution network includes at least one distribution transformer that steps down the voltage on the at least one electrical line for powering a load, and a shunt across a secondary side of the transformer so as to increase power on the at least one electrical line to provide power for the current sensors.

17. The system according to claim 16 wherein the shunt is a semiconductor device.

18. The system according to claim 17 wherein the semiconductor device is periodically switched on and off to provide the shunt.

* * * * *